United States Patent [19]
Gazda et al.

[11] Patent Number: 5,703,540
[45] Date of Patent: Dec. 30, 1997

[54] VOLTAGE-CONTROLLED CRYSTAL OSCILLATOR WITH EXTENDED RANGE

[75] Inventors: Jan Gazda; Jagdeep Bal; Christopher J. Bland, all of San Jose, Calif.

[73] Assignee: MicroClock Incorporated, San Jose, Calif.

[21] Appl. No.: 703,666

[22] Filed: Aug. 27, 1996

[51] Int. Cl.⁶ .................... H03L 7/06; H03L 7/18
[52] U.S. Cl. .................... 331/16; 331/18; 331/25; 327/156; 327/106; 455/260; 455/264
[58] Field of Search .................. 331/1 A, 16, 18, 331/17, 25, 74, 177 R; 327/156–159, 106; 455/260, 264

[56] References Cited

U.S. PATENT DOCUMENTS 5,382,922   1/1995   Gersbach et al. ............... 331/16 X

*Primary Examiner*—David Mis
*Attorney, Agent, or Firm*—Townsend and Townsend and Crew

[57] ABSTRACT

A voltage-controlled crystal oscillator circuit with an extended range is presented. The circuit has a crystal oscillator circuit, a phase-locked loop (PLL), and a look-up table. The crystal oscillator circuit generates a signal having a frequency $f_{ref}$ at its output node responsive to a voltage at its input terminal. The PLL has its input node connected to the crystal oscillator output node and generates a signal at the PLL output node having a frequency $f_o$. A first divider circuit of the PLL divides the $f_{ref}$ frequency by a first variable integer M and a second PLL divider circuit divides the $f_o$ frequency by a second variable integer N. The look-up table, which has comparators connected to the input terminal, a counter connected to the comparators and a memory responsive to the counter and storing M and N values, varies M and N responsive to the input terminal voltage so that the voltage-controlled crystal oscillator circuit has an increased frequency range.

16 Claims, 2 Drawing Sheets

VOLTAGE-CONTROLLED CRYSTAL OSCILLATOR WITH EXTENDED RANGE

BACKGROUND OF THE INVENTION

The present invention is related to crystal oscillator circuits and, more particularly, to voltage-controlled crystal oscillator circuits.

The voltage-controlled crystal oscillator (VCXO) is a widely used component in many electronic circuits and applications. It is used, for example, in communications systems. As the name implies, the voltage-controlled crystal oscillator consists of a conventional crystal oscillator which is tuned by an externally applied voltage. This tuning voltage changes the frequency of oscillation of the crystal depending on the voltage applied.

A crystal oscillator oscillates at its resonant frequency, which is determined primarily by the physical dimensions and orientation of the quartz crystal. An important property of a quartz crystal oscillator is that it has a very high quality factor or Q. This means that the frequency of oscillation is very tightly controlled and varies very little.

To deliberately change this frequency (or "pull" the crystal) is difficult, i.e., the frequency can only be changed by a small amount. In practice, a VCXO has a range of, at most, a few hundred parts per million (ppm). This narrow "pull range" is an important advantage. For example, in a system where an oscillator must be tuned to an externally known frequency, a VCXO of the same nominal frequency can be used. The initial error between the 2 frequencies is small (since the VCXO can only change by a few hundred ppm) and the system will not lock on to harmonics of the external frequency because the VCXO cannot generate them. In addition, the VCXO has a very low gain (a unit change in input voltage only causes a small change in frequency). This can be very useful if the VCXO is included as part of a larger feedback loop.

Nonetheless, it is sometimes desirable that a VCXO have an increased frequency range. It is possible to make a crystal slightly easier to pull when it is manufactured. This is called a "pullable" crystal. When building a VCXO, it is usual to specify a pullable crystal to allow a wider range. A common frequency required for a VCXO is 27 MHz, for instance. However, a 27 MHz fundamental mode crystal is more expensive than a lower frequency crystal, such as a crystal which operates at 14.31818 MHz. This is particularly true for pullable crystals with the 27 MHz crystal being more than twice the cost of 14.31818 MHz.

To lower the expense of crystals, the present invention provides for a voltage-controlled crystal oscillator which has an expanded frequency range. The present invention avoids higher frequency, pullable crystals, while the voltage-controlled crystal oscillator generates output signals at such higher frequencies accurately and under control.

SUMMARY OF THE INVENTION

The present invention provides for a voltage-controlled crystal oscillator with an expanded frequency range. The voltage-controlled crystal oscillator has a crystal oscillator circuit generating a signal having a frequency $f_{ref}$ about a fundamental frequency responsive to a tuning voltage at an input terminal. A phase-locked loop operating as a frequency multiplier is connected to the voltage-controlled oscillator to generate a signal having a frequency $f_o$. The phase-locked loop has a first divider circuit dividing the $f_{ref}$ frequency by a first variable integer M and a second divider circuit dividing the $f_o$ frequency by a second variable integer N to generate the signal having the frequency $f_o$. A look-up table for M and N values is connected to the first and second divider circuits and varies M and N when the tuning voltage exceeds a range defined by two predetermined reference voltages so that the voltage-controlled crystal oscillator circuit has an increased frequency range. Additionally, the signal frequency from the phase-locked loop is divided by a divider circuit having a fixed divisor. The divider circuit increases the frequency resolution available by increasing the possible combinations of M and N, as compared to the M and N values available if the output terminal of the phase-locked loop were to generate desired output frequency without the divider circuit.

The result of the present invention is that an oscillating crystal with a fundamental frequency of 14.31818 MHz in the VCXO may be used to obtain a signal with an extended frequency range about a desired output frequency of 27 MHz.

Operationally, the present invention provides for a method of extending the frequency range of a voltage-controlled crystal oscillator. A first signal is generated at a first frequency $f_{ref}$ from an oscillating crystal having a fundamental frequency. The first frequency varies about the fundamental frequency in response to a tuning voltage. The first frequency is multiplied by a factor M/N, where M and N are integers, to generate a second signal at a second frequency. M and N are varied when the tuning voltage exceeds a predetermined voltage range to obtain an extended second frequency range. If the second frequency is then divided by a fixed integer, and M and N correspondingly adjusted to compensate for the fixed integer divisor, the same nominal output frequency is obtained with increased resolution since an increased number of M and N combinations are available.

DETAILED DESCRIPTION OF PREFERRED EMBODIMENTS

The present invention uses a voltage-controlled crystal oscillator (VCXO) which operates with a crystal having a lower fundamental frequency than the desired output frequency. The higher target frequency is generated by a phase-locked loop (PLL) operating as a frequency multiplier. In the particular embodiment of the present invention, a crystal having a fundamental frequency of 14.31818 MHz is used to generate an output signal at the target frequency of 27 MHz. Of course, the present invention is applicable for other frequencies. A particular VCXO which operates with the present is disclosed in companion U.S. Appln. Ser. No. 08/703,670, entitled "A FULLY INTEGRATED VOLTAGE-CONTROLLED CRYSTAL OSCILLATOR,"

filed of even date by some of the inventors of the present application and assigned to the present assignee. However, the present invention is not limited to the described VCXO; the present invention is applicable to other VCXOs.

Figure 1:
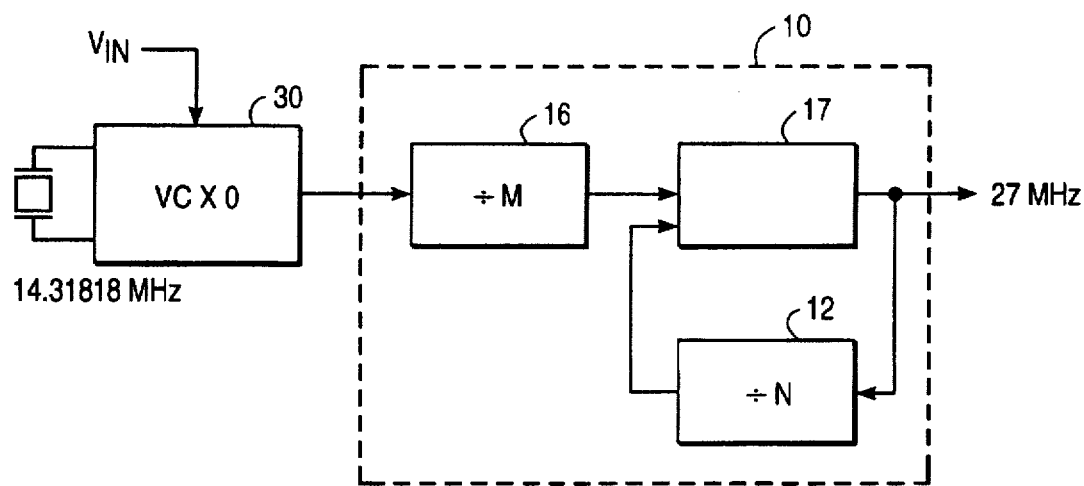
FIG. 1 is a circuit diagram of a voltage-controlled crystal oscillator (VCXO) circuit which generates an output signal with one frequency from a crystal oscillator signal of another frequency.

As shown in FIG. 1, a voltage-controlled crystal oscillator (VCXO) 30 having a fundamental frequency of 14.31818 MHz is connected to an input terminal of a phase-locked loop (PLL) 10. The PLL 10 operates as frequency multiplier so that the frequency of the output signal is 27 MHz.

Figure 2:
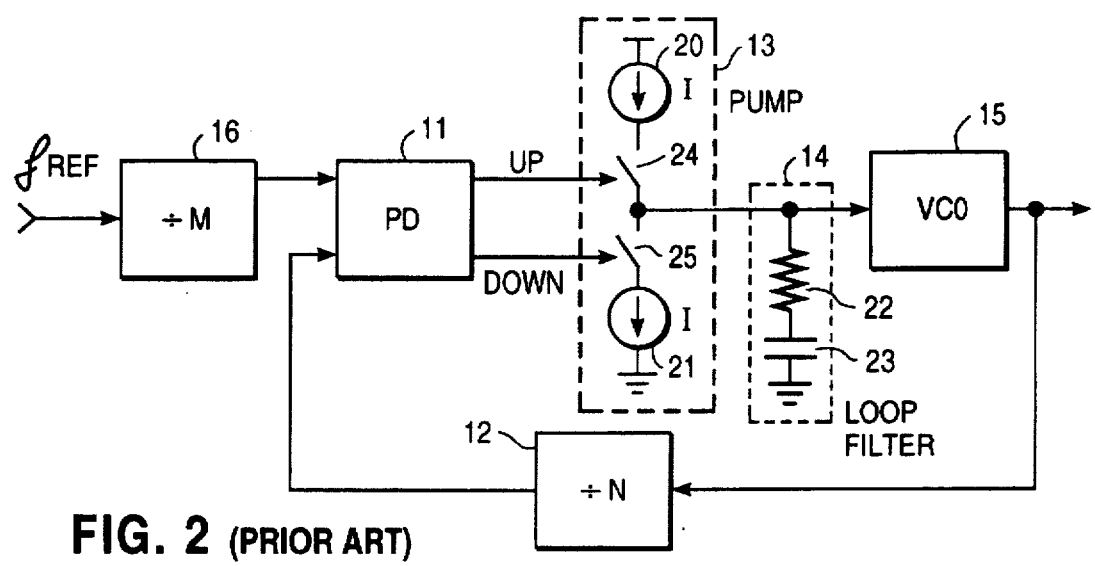
FIG. 2 is a circuit diagram of the phase-locked loop (PLL) in FIG. 1.

The PLL 10 is a conventional PLL circuit with a divider circuits 16 and 12. The remainder of the PLL is illustrated by a block 17. FIG. 2 shows the PLL 10 in greater detail. The PLL 10 receives the output signal of the VCXO 30 at the reference frequency, $f_{REF}$ (14.31818 MHz), at an input terminal to the divider circuit 16. The divide circuit 16 divides, or slows, the incoming signal by a predetermined amount M.

The output of divider circuit 16 is connected to one of two inputs of a phase detector circuit 11, which has its output connected to a charge pump circuit 13, which is represented by switches responsive to the phase detector circuit and reference current circuits 20 and 21. The charge pump circuit 13 is also connected to a loop filter circuit, a series-connected capacitor 23 and resistor 22. Also connected to the same node is an input terminal of a voltage-controlled oscillator (VCO) 15 which has an output terminal forming the output terminal of the PLL 10. The output terminal of the VCO 15 is also connected to the second divider circuit 12, which divides the frequency of the output signal by a predetermined amount N. A feedback relationship is established by the connection of the output of the divider circuit 12 to the second input of the phase detector circuit 11.

The clock frequencies of the two input signals to the phase detector 11 are $f_{REF}/M$ and $f_{VCO}/N$ and the feedback arrangement of the PLL circuit keeps the two frequencies the same. The phase detector 11 compares the phase and frequency of the rising edges of the two input signals and generates one of three states. If the phase and frequency of the two input signals are the same, the loop is locked. Neither UP nor DOWN signal is asserted and the two switches 24 and 25 in the charge pump 13 remain open. The voltage stored on the loop filter capacitor 23 is unchanged and the voltage-controlled oscillator (VCO) 15 continues to run at the same frequency.

If the reference input to the phase detector circuit 11 is running faster than the VCO input, the output signal of the VCO 15 is running too slow. In this case, the phase detector 11 generates an UP signal which turns on the upper switch 24 in the charge pump circuit 13 and so charges the loop filter capacitor 23. This raises the frequency of the VCO 15 signal until the two input signals to the phase detector circuit 11 are the same.

Conversely, if the reference input signal to the phase detector circuit 11 is running slower than the VCO output signal, the VCO 15 is running too fast. In this case, the phase detector circuit 11 generates a DOWN signal that turns on the lower switch 25 in the charge pump circuit 13 and so discharges the loop filter capacitor 23. This lowers the speed of the VCO 15 until the two input signals to the phase detector circuit 11 are the same.

As described above, a property of phase-locked loops is that the feedback loop (the phase detector 11, charge pump 13, loop filter 14, VCO 15 and the divider circuit 12) makes the two input signals to the phase detector 11 run at the same frequency. In quantitative terms, since one input signal has frequency $f_{REF}$ divided by M, and the other input is $f_{VCO}$ divided by N, then:

$$\frac{f_{REF}}{M} = \frac{f_{VCO}}{N}$$

or $$f_{VCO} = \frac{N}{M} f_{REF}$$

This is the basic equation for frequency synthesis and allows the generation of frequencies which are fractions of a reference frequency (the fraction can be greater than one).

By selecting M=35 and N=66, the first equation above becomes:

$$\frac{14.31818}{35} = \frac{27}{66}$$

In this fashion, a 27 MHz clock signal is synthesized from a 14.31818 MHz input signal and a 27 MHz VCXO is created using a 14.31818 MHz crystal. As the frequency of the 14.31818 MHz crystal is changed (or pulled), the PLL 10 keeps the 27 MHz output frequency locked to the input reference frequency so that the 27 MHz frequency changes by a corresponding amount.

Figure 3:
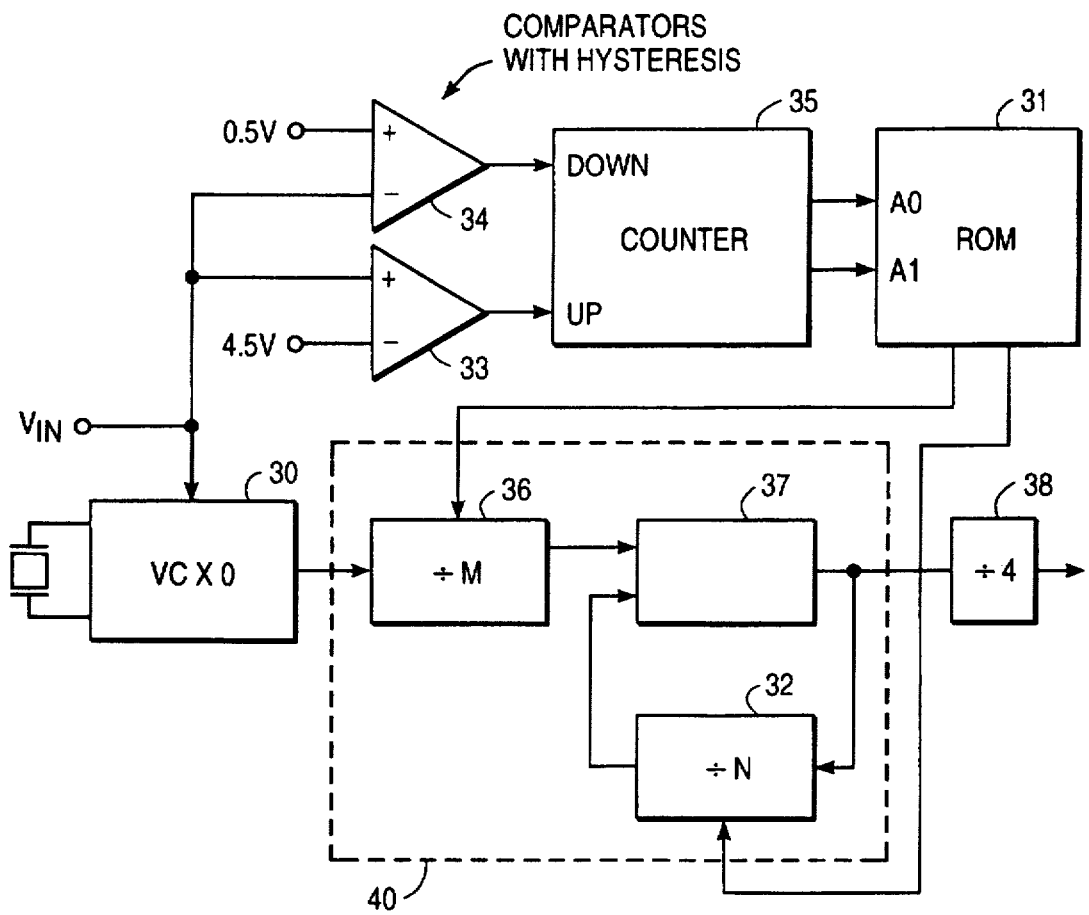
FIG. 3 is a circuit diagram of a modified voltage-controlled crystal oscillator (VCXO) circuit with an extended frequency range, according to the present invention.

To increase the tuning range of the VCXO 30, the circuit of FIG. 1 is modified as illustrated in FIG. 3. In place of the fixed divider circuits 16 and 12 of FIG. 1, the FIG. 3 circuit has programmable divider circuits 36 and 32 respectively in its PLL circuit 40. The values for the divisors for the programmable divider circuits 36 and 32 are supplied by a ROM (Read-Only Memory) 31. These output signals from the ROM 31 are responsive to address signals from a counter circuit 35 which, in turn, is responsive to the output signals of two comparator circuits 33 and 34. An input terminal of each of the comparator circuits 33 and 34 is connected to the input terminal of the VCXO input terminal which receives the control signal $V_{IN}$. A second input terminal of each of the comparator circuits 33 and 34 is connected to different reference voltages.

The PLL 40 of the FIG. 3 circuit operates incrementally in different reference frequency ranges. As the $V_{IN}$ pulls the frequency of the VCXO 30 signal, the divisors M and N for the programmable divider circuits 36 and 32 are changed so that PLL 40 can track the reference frequency from the VCXO 30. Thus $V_{IN}$ not only varies the frequency of the VCXO 30, but also may trigger one of the comparators 33 and 34 when $V_{IN}$ moves beyond a range defined by the reference voltages at the second input terminals of the comparators 33 and 34. In response to the comparators 33 and 34, the counter 35 either increments or decrements. The value of the counter 35 addresses the ROM 31 and the addressed memory location holds the values of M and N for the programmable divider circuits 36 and 32.

For the PLL 10 in FIG. 1, if M and N were 35 and 66, a 27 MHz signal is obtained from a 14.31818 MHz reference VCXO signal. To increase the resolution in the ranges of output frequencies of the PLL 40, a fixed divider circuit 38 with a divisor of 4 is connected to the output terminal of the PLL 40. The values of M and N from the ROM 31 are accordingly adjusted so that the frequency of the output of the divider circuit 38 is centered about 27 MHz. In this case, M remains at 35, but N is multiplied by 4 to compensate for the output divide-by-4 operation, i.e., N=264. The frequency multiplication operation by the PLL 40 is increased by a factor of 4, which permits a greater number of combinations of M and N to "fine tune" the frequency of the signal from the PLL 40 (and the divider circuit 38).

The tuning voltage $V_{IN}$ is monitored by the two comparators 33 and 34. The range for the VCXO 30 is determined to be +0.5 to +4.5V. Hence, the limits of this range are used as the reference voltages for the comparators 33 and 34. Of course, other ranges are possible.

If $V_{IN}$ exceeds +4.5V, the comparator 33 generates an UP signal to the counter 35 that causes the counter 35 to increment. This changes the address signals to the ROM 31 and thus changes the M and N values from the ROM output. This, in turn, causes the PLL 40 to synthesize a new frequency from the changed M and N values.

If the tuning voltage $V_{IN}$ is less than +0.5V, the comparator 34 issues a DOWN signal to the counter 35 and the M and N values from the ROM 31 are accordingly changed. To stop the PLL 40 from changing immediately from the lowest address to the highest address, the comparators 33 and 34 have hysteresis so that once an UP signal, for example, is generated, another UP signal is not generated until the tuning voltage $V_{IN}$ has fallen to a lower value and risen again. Alternatively, a delay may be added so that another UP signal cannot be generated until after the delay period. Of course, a combination of both hysteresis and delay techniques can also be used. In addition, the counter 35 is designed so that it cannot roll over.

In the described embodiment, the ROM 31 has four memory locations. The ROM 31 is shown as being connected to two address lines from the up/down counter 35. Thus there are four possible addresses. The addresses are arranged as follows:

| Address | M | N | Center Frequency | Accuracy (ppm) |
|---|---|---|---|---|
| 0 | 59 | 445 | 26.998263 | −64 |
| 1 | 35 | 264 | 27.0 | 0 |
| 2 | 46 | 347 | 27.00222 | −82 |
| 3 | 57 | 430 | 27.003585 | +133 |

One location (address 1) holds M=35 and N=264 for the PLL 40 to generate an exact 27 MHz signal, i.e., the center frequency of the programmed PLL 40 (and the divider circuit 38) has zero deviation from 14.31818 MHz. Note that N=66×4, which accommodates the division by 4 by the divider circuit 38. With M=59 and N=445, the PLL 40 has a center output frequency of 26.998263 MHz, which is 64 ppm slow (compared to 27 MHz). Similarly, setting M=46 and N=347 yields 27.00222 MHz, which is 82 ppm fast; and setting M=57 and N=430 yields 27.003585 MHz, which is 133 ppm fast.

Figure 4:
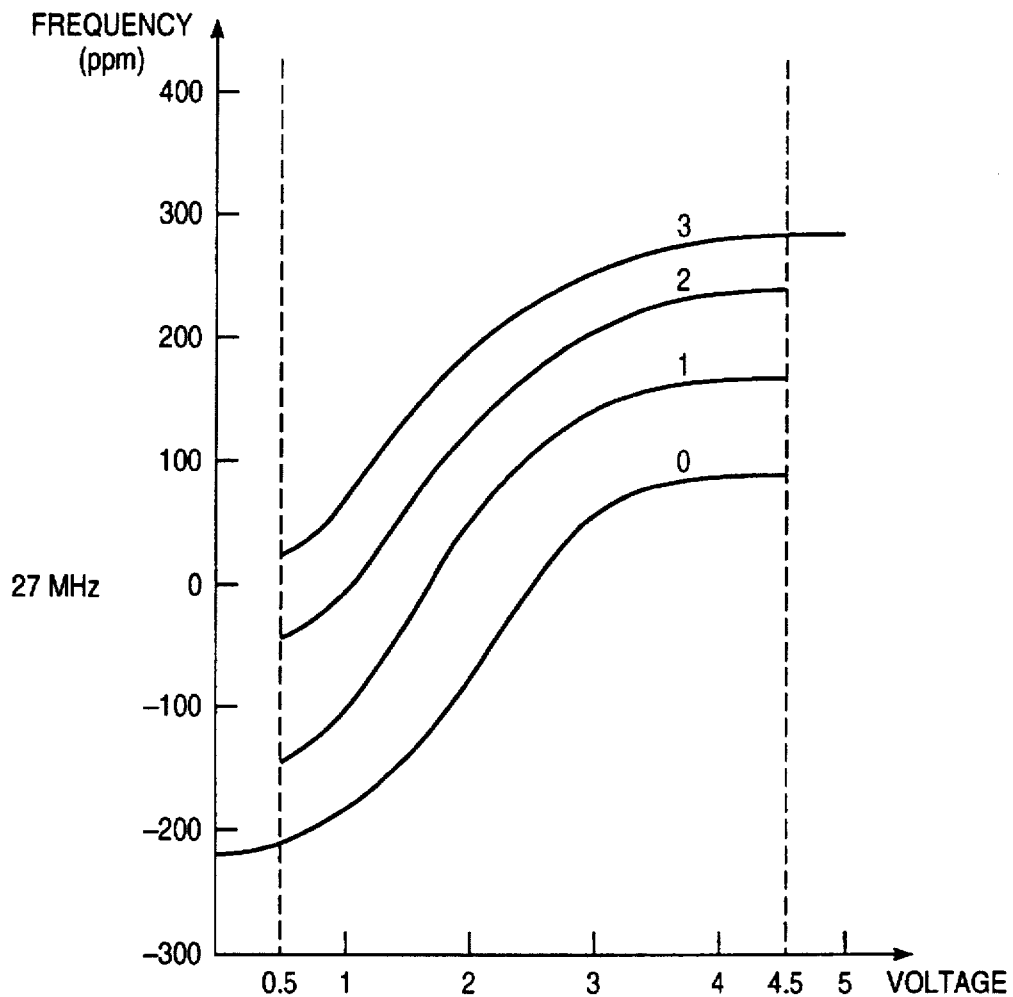
FIG. 4 is a plot of frequency versus control voltage for the VCXO circuit of FIG. 3.

Thus the FIG. 3 circuit has multiple tuning characteristics which can all be accessed from one tuning voltage. If the circuit starts with address 0, the tuning characteristics are the same as those of the FIG. 1 circuit, except that the frequency axis is shifted down by 64 ppm. This is graphically illustrated by FIG. 4. The lowest curve corresponds to address 0 and so on. The tuning range is extended from about 300 ppm total to about −220 ppm to +280 ppm, or 500 ppm total. By adding a larger ROM and counter, the range can be extended even further.

While various preferred and alternate embodiments of the pesent invention have been disclosed and described in detail, it should be evident that the present invention is equally applicable by making appropriate modifications to the embodiment described above. Therefore, the above description should not be taken as limiting the scope of invention which is defined by the metes and bounds of the appended claims.

What is claimed is:

1. A voltage-controlled crystal oscillator circuit comprising
    a crystal oscillator circuit having an input terminal and an output node, said crystal oscillator circuit generating at said output node a signal having a frequency $f_{ref}$ responsive to a voltage at said input terminal;
    a phase-locked loop having an input node connected to said output node of said crystal oscillator and an output node, said phase-locked loop generating a signal at said output node having a frequency $f_o$, said phase-locked loop having a first divider circuit dividing said $f_{ref}$ frequency by a first variable integer M and a second divider circuit dividing said $f_o$ frequency by a second variable integer N; and
    means for varying M and N responsive to said input terminal voltage;
    whereby said voltage-controlled crystal oscillator circuit has an increased frequency range.

2. The voltage-controlled crystal oscillator circuit of claim 1 wherein said varying means varies M and N when said input terminal voltage exceeds a range defined by two predetermined reference voltages.

3. The voltage-controlled crystal oscillator circuit of claim 2 wherein said varying means comprises
    first and second comparators, each having an input node connected to said input terminal, each comparator generating an output signal when said input terminal voltage exceeds one of said predetermined reference voltages;
    a counter connected to said first and second comparators, said counter incrementing or decrementing responsive to output signals from said first and second comparators; and
    a memory addressed by said counter, said memory connected to said first and second divider circuits and storing different values of M and N for varying M and N in said first and second divider circuits thereby responsive to said counter.

4. The voltage-controlled crystal oscillator circuit of claim 3 wherein said first and second comparators have hysteresis to prevent said comparators from generating a continuing output signal.

5. The voltage-controlled crystal oscillator circuit of claim 3 wherein said first and second comparators operate with delay such that said comparators are prevented from generating a continuing output signal.

6. The voltage-controlled crystal oscillator circuit of claim 1 further comprising a fixed divider circuit connected to said output node of said phase-locked loop, said fixed divider circuit generating an output signal for said voltage-controlled crystal oscillator circuit.

7. The voltage-controlled crystal oscillator circuit of claim 6 wherein said fixed divider circuit dividing said $f_o$ frequency by 4.

8. The voltage-controlled crystal oscillator circuit of claim 7 wherein said crystal oscillator circuit further comprises an oscillating crystal having a fundamental frequency at 14.31818 MHz and wherein said memory stores values of M=35 and N=264 so that said voltage-controlled crystal oscillator circuit has an output signal having a frequency centered about 27 MHz.

9. The voltage-controlled crystal oscillator circuit of claim 8 wherein said memory further stores values of M=59, 46 and 57, and N=445, 347 and 430 correspondingly.

10. A voltage-controlled crystal oscillator circuit with expanded frequency range, said voltage-controlled crystal oscillator comprising a crystal oscillator circuit having an input terminal and an output node, said crystal oscillator circuit generating at said output node a signal having a frequency $f_{ref}$ responsive to a voltage at said input terminal;

a phase-locked loop having an input node connected to said output node of said crystal oscillator and an output node, said phase-locked loop generating a signal at said output node having a frequency $f_o$, said phase-locked loop having a first divider circuit dividing said $f_{ref}$ frequency by a first variable integer M and a second divider circuit dividing said $f_o$ frequency by a second variable integer N; and a look-up table for M and N values connected to said first and second divider circuits, said look-up table varying M and N responsive to said input terminal voltage;

whereby said voltage-controlled crystal oscillator circuit has an increased frequency range.

11. The voltage-controlled crystal oscillator circuit of claim 10 wherein said look-up table varies M and N when said input terminal voltage exceeds a range defined by two predetermined reference voltages.

12. The voltage-controlled crystal oscillator circuit of claim 11 wherein said look-up table means comprises first and second comparators, each having an input node connected to said input terminal, each comparator generating an output signal when said input terminal voltage exceeds one of said predetermined reference voltages;

a counter connected to said first and second comparators, said counter incrementing or decrementing responsive to output signals from said first and second comparators; and a memory addressed by said counter, said memory connected to said first and second divider circuits and storing different values of M and N for varying M and N in said first and second divider circuits thereby responsive to said counter.

13. A method of expanding the frequency range of a voltage-controlled crystal oscillator, said method comprising generating a first signal at a first frequency $f_{ref}$ from an oscillating crystal having a fundamental frequency, said first frequency varying about said fundamental frequency in response to a tuning voltage;

multiplying said first frequency by a factor M/N, where M and N are integers, to generate a second signal at a second frequency; and varying M and N when said tuning voltage exceeds a predetermined voltage range;

whereby a widened frequency range about said second frequency is generated.

14. The method of claim 13 further comprising dividing said second frequency by a fixed integer to generate an output frequency about a target frequency.

15. The method of claim 14 wherein said fundamental frequency comprises 14.31818 MHZ and said target frequency comprises 27 MHz.

16. The method of claim 14 wherein said fixed integer comprises four.

* * * * *